(12) United States Patent
Chung

(10) Patent No.: US 8,278,967 B2
(45) Date of Patent: Oct. 2, 2012

(54) DATA DRIVING IMPEDANCE AUTO-CALIBRATION CIRCUIT AND SEMICONDUCTOR INTEGRATED CIRCUIT USING THE SAME

(75) Inventor: Won Kyung Chung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 12/844,474

(22) Filed: Jul. 27, 2010

(65) Prior Publication Data

US 2011/0074462 A1  Mar. 31, 2011

(30) Foreign Application Priority Data

Sep. 30, 2009  (KR) .................. 10-2009-0093597

(51) Int. Cl.
   *H03K 17/16*  (2006.01)
   *H03K 19/003*  (2006.01)

(52) U.S. Cl. ................ 326/30; 326/32; 326/34; 326/86

(58) Field of Classification Search .............. 326/30–32; 365/189.05, 189.06, 189.09

See application file for complete search history.

(56) References Cited

U.S. PATENT DOCUMENTS

| | | | |
|---|---|---|---|
| 6,834,017 B2 | 12/2004 | Perner et al. | |
| 7,068,557 B2 | 6/2006 | Norman et al. | |
| 7,170,313 B2 | 1/2007 | Shin | |
| 7,176,711 B2 | 2/2007 | Park et al. | |
| 7,209,401 B2 | 4/2007 | Norman et al. | |
| 7,257,036 B2 | 8/2007 | Chang et al. | |
| 7,590,008 B1 | 9/2009 | Roge et al. | |
| 2008/0252332 A1* | 10/2008 | Lee et al. ................ | 326/30 |
| 2010/0177588 A1* | 7/2010 | Kaiwa et al. ............ | 365/233.11 |

FOREIGN PATENT DOCUMENTS

| | | |
|---|---|---|
| JP | 2005-285125 | 10/2005 |
| JP | 2006-129423 | 5/2006 |
| KR | 1020040092416 A | 11/2004 |
| KR | 1020090121470 A | 11/2009 |

* cited by examiner

*Primary Examiner* — Shawki S Ismail
*Assistant Examiner* — Jany Tran
(74) *Attorney, Agent, or Firm* — William Park & Associates Ltd.

(57) ABSTRACT

A data driving impedance auto-calibration circuit includes: a detection block configured to calibrate a characteristic voltage generated by detecting an operation characteristic variation of an element, according to a code signal, and generate a calibrated characteristic voltage; a comparison block configured to compare the calibrated characteristic voltage with a reference voltage and output a comparison result signal; and a code calibration block configured to calibrate the code signal according to the comparison result signal.

16 Claims, 6 Drawing Sheets

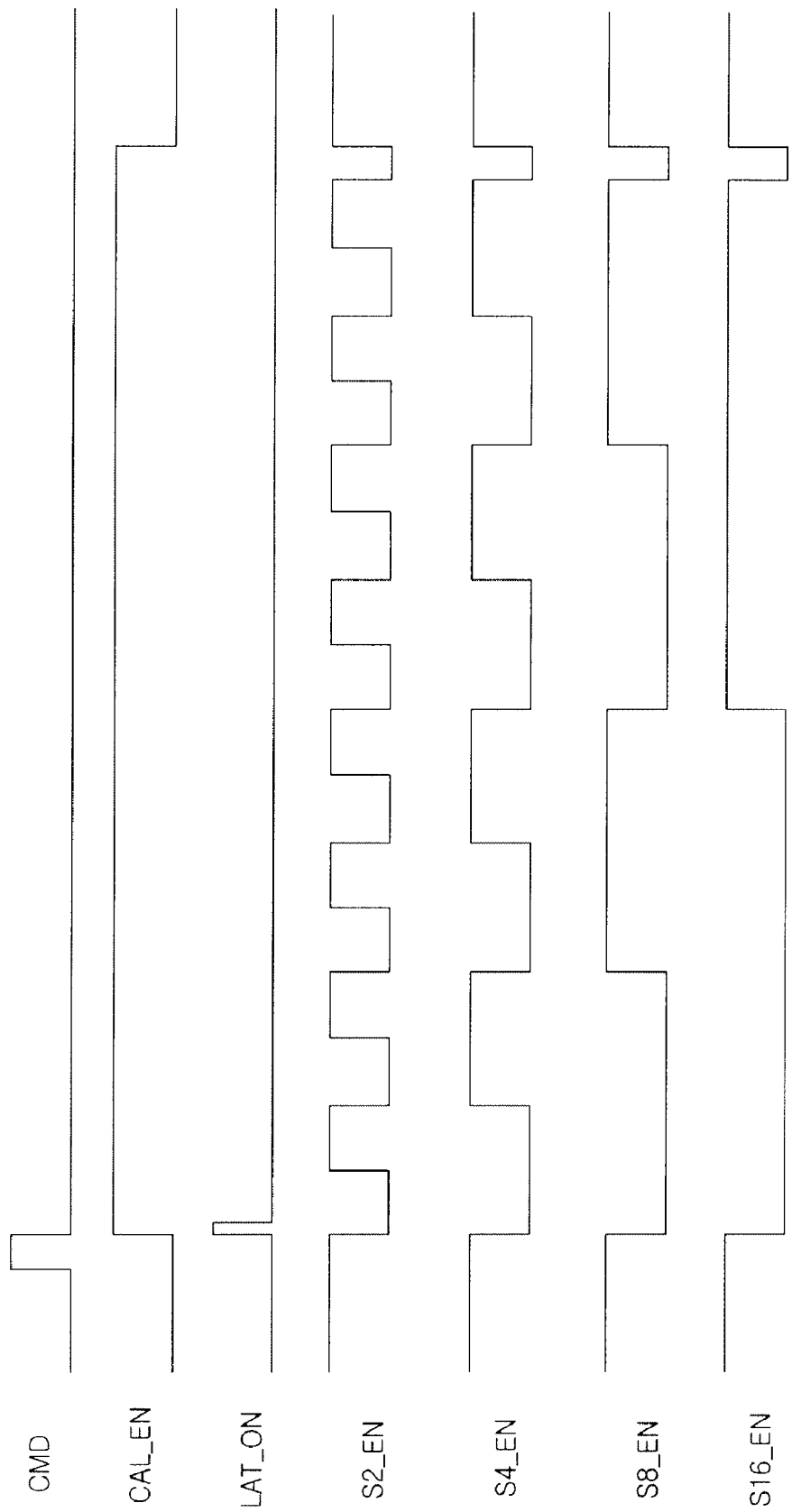

US 8,278,967 B2

DATA DRIVING IMPEDANCE AUTO-CALIBRATION CIRCUIT AND SEMICONDUCTOR INTEGRATED CIRCUIT USING THE SAME

CROSS-REFERENCES TO RELATED APPLICATION

The present application claims priority under 35 U.S.C. §119(a) to Korean application number 10-2009-0093597, filed on Sep. 30, 2009, in the Korean Intellectual Property Office, which is incorporated herein by reference in its entirety as set forth in full.

BACKGROUND

1. Technical Field

The present invention relates to semiconductor circuit technology, and more particularly, to a data driving impedance auto-calibration circuit and a semiconductor integrated circuit using the same.

2. Related Art

As an example of a semiconductor integrated circuit, a semiconductor memory device includes a data driver for driving data.

The driving impedance values for a data driver are designed to match a target value which may be used to define a chartable region of valid data output between the data driver and its load. This chartable region thus defines a data output characteristic of the data driver and is referred to as a "data eye" due to the shape formed by the data output characteristic when plotted. Unfortunately, the driving impedance of the data driver may vary from a target value to a different value, due to process, voltage or temperature (PVT) variations.

When the driving impedance of the data driver is changed to a different value from the target value, the data output characteristic, that is, the data eye, which defines a region of valid data, may becomeunstable.

Therefore, there is a demand for the development of technology which is capable of constantly maintaining the driving impedance of the data driver in correspondence to the PVT variation.

SUMMARY

A data driving impedance auto-calibration circuit, which is capable of constantly maintaining driving impedance of data drivers in correspondence to a PVT variation, and a semiconductor integrated circuit using the same are described herein.

The disclosed embodiments provide an integrated circuit having a data driving impedance auto-calibration circuit that is configured to maintain a data driving impedance by detecting operation characteristic variations within the integrated circuit and adjusting the data driving impedance in response to the variations. The data driving impedance is adjusted such that stability of the data eye is maintained. In other words, the data driving impedance is maintained such that the data driver outputs correct data. The operation characteristic variations may be due to process, voltage or temperature variations. In some embodiments, the data driving impedance auto-calibration circuit is further configured to detect an operation characteristic variation of an integrated circuit element, and, in response, generate a calibrated characteristic voltage. The data driving impedance auto-calibration circuit may also compare the calibrated characteristic voltage with a reference voltage and output a comparison result signal, and calibrate a code signal according to the comparison result signal, and use the code signal to adjust the data driving impedance. In some embodiments, the target impedance may define, for example, a set and/or range of target impedance values that are acceptable so that the data driver outputs valid data. In one embodiment, a data driving impedance auto-calibration circuit includes: a detection block configured to calibrate a characteristic voltage generated by detecting an operation characteristic variation is of an element, according to a code signal, and generate a calibrated characteristic voltage; a comparison block configured to compare the calibrated characteristic voltage with a reference voltage and output a comparison result signal; and a code calibration block configured to calibrate the code signal according to the comparison result signal.

In another embodiment of the present invention, a semiconductor integrated circuit includes: a core block comprising a memory area and a circuit configuration for writing and reading data to and from the memory area; a data driver block configured to drive data outputted from the core block to an impedance which is set according to a code signal; and a data driving impedance calibration block configured to calibrate a code value of the code signal depending on a difference between a characteristic voltage and a target value, the characteristic voltage being generated by detecting an operation characteristic variation of an element through a sampler inside the data driving impedance calibration block.

BRIEF DESCRIPTION OF THE DRAWINGS

Features, aspects, and embodiments are described in conjunction with the attached drawings, in which:

FIG. 8 is a timing diagram explaining the operation of the embodiment.

DETAILED DESCRIPTION

Hereinafter, a data driving impedance auto-calibration circuit and a semiconductor integrated circuit using the same according to embodiments of the present invention will be described below with reference to the accompanying drawings through exemplary embodiments.

Figure 1:
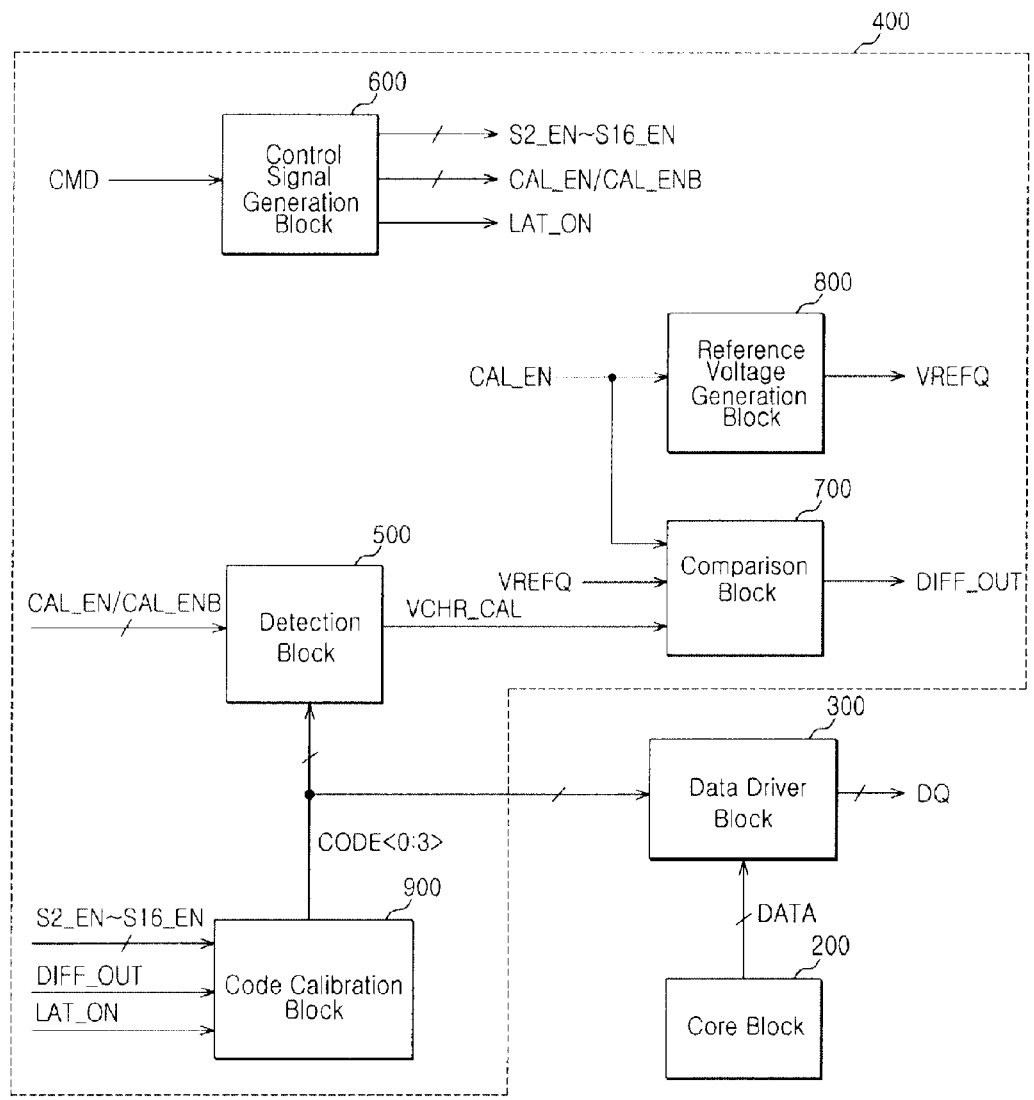
FIG. 1 is a block diagram of a semiconductor integrated circuit according to one embodiment.

Referring to FIG. 1, a semiconductor integrated circuit 100 according to one embodiment includes a core block 200, a data driver block 300, and a data driving impedance calibration block 400. The core block 200 is operatively coupled to the data driver block 300, which is further operatively coupled to the data driving impedance calibration block 400. The terminology "operatively coupled" as used herein refers to coupling that enables operational and/or functional communication and relationships there-between and may include any intervening items necessary to enable such communication such as, for example, data communication buses or any other necessary intervening items that one of ordinary skill would understand to be present. Also, it is to be understood that other intervening items may be present between "operatively coupled" items even though such other intervening items are not necessary to the functional communication facilitated by the operative coupling. For example, a data communication bus may provide data to several items along a pathway along which two or more blocks are operatively coupled, etc. Such operative coupling is shown generally in the figures described herein.

The core block 200 includes a memory area composed of a plurality of memory cells which are used as a basic unit for storing data and also includes relevant circuits used for writing and reading data.

The data driver block 300 is configured to drive data read from the core block 200 to a driving impedance which is set according to code signals CODE<0:3>, and output the data through a data input/output terminal DQ. The data driver block 300 includes a plurality of data drivers.

The data driving impedance calibration block 400 is provided inside the semiconductor integrated circuit, and configured to calibrate the code values of the code signals CODE<0:3> according to an output of a sampler which is configured to detect operation characteristic variations of basic elements composing the semiconductor integrated circuit. The basic elements composing the is semiconductor integrated circuit may include transistors.

The data driving impedance calibration block 400 includes a detection block 500, a control signal generation block 600, a comparison block 700, a reference voltage generation block 800, and a code calibration block 900. The detection block 500 is operatively coupled to the comparison block 700 and to the code calibration block 900.

The detection block 500, is also operatively coupled to the control signal generation block 600, and is enabled in response to calibration period signals CAL_EN and CAL_ENB. The detection block 500 is configured to calibrate a characteristic voltage VCHR according to the code signals CODE<0:3> and output a calibrated characteristic voltage VCHR_CAL to the comparison block 700. The characteristic voltage VCHR is generated, by the detection block 500, by detecting the operation characteristics variations of the basic elements composing the semiconductor integrated circuit. The detection block 500 may be implemented in some embodiments by modeling a data driver provided in the data driver block 300.

The control signal generation block 600 is configured to generate the calibration period signals CAL_EN and CAL_ENB, trigger signals S2_EN through S16_EN, and a code initialization signal LAT_ON as signals for controlling the operation timing of the data driving impedance calibration block 400 in response to a command CMD. The control signal generation block is operatively coupled to the detection block 500, the reference voltage generation block 800, and the code calibration block 900.

As the command CMD, a power up signal, a refresh signal, a mode register set signal and so on may be used. Therefore the control signal generation block 600 may be operatively coupled to an appropriate portion of the integrated circuit 100 so as to obtain a power up signal, refresh signal or mode register set signal, etc.

The comparison block 700 is configured to compare the calibrated characteristic voltage VCHR_CAL, obtained from the detection block 500, with a reference voltage VREFQ and output a comparison result signal DIFF_OUT.

The reference voltage generation block 800 is enabled in response to the period calibration signal CAL_EN and configured to divide a power supply voltage VDDQ to generate the reference voltage VREFQ having a preset level, for example, a level corresponding to the half of the power supply voltage VDDQ.

The code calibration block 900 is configured to initialize the code signals CODE<0:3> in response to the code initialization signal LAT_ON, enable a code calibration operation according to the trigger signals S2_EN through S16_EN, and calibrate the code signals CODE<0:3> according to the comparison result signal DIFF_OUT.

Figure 2:
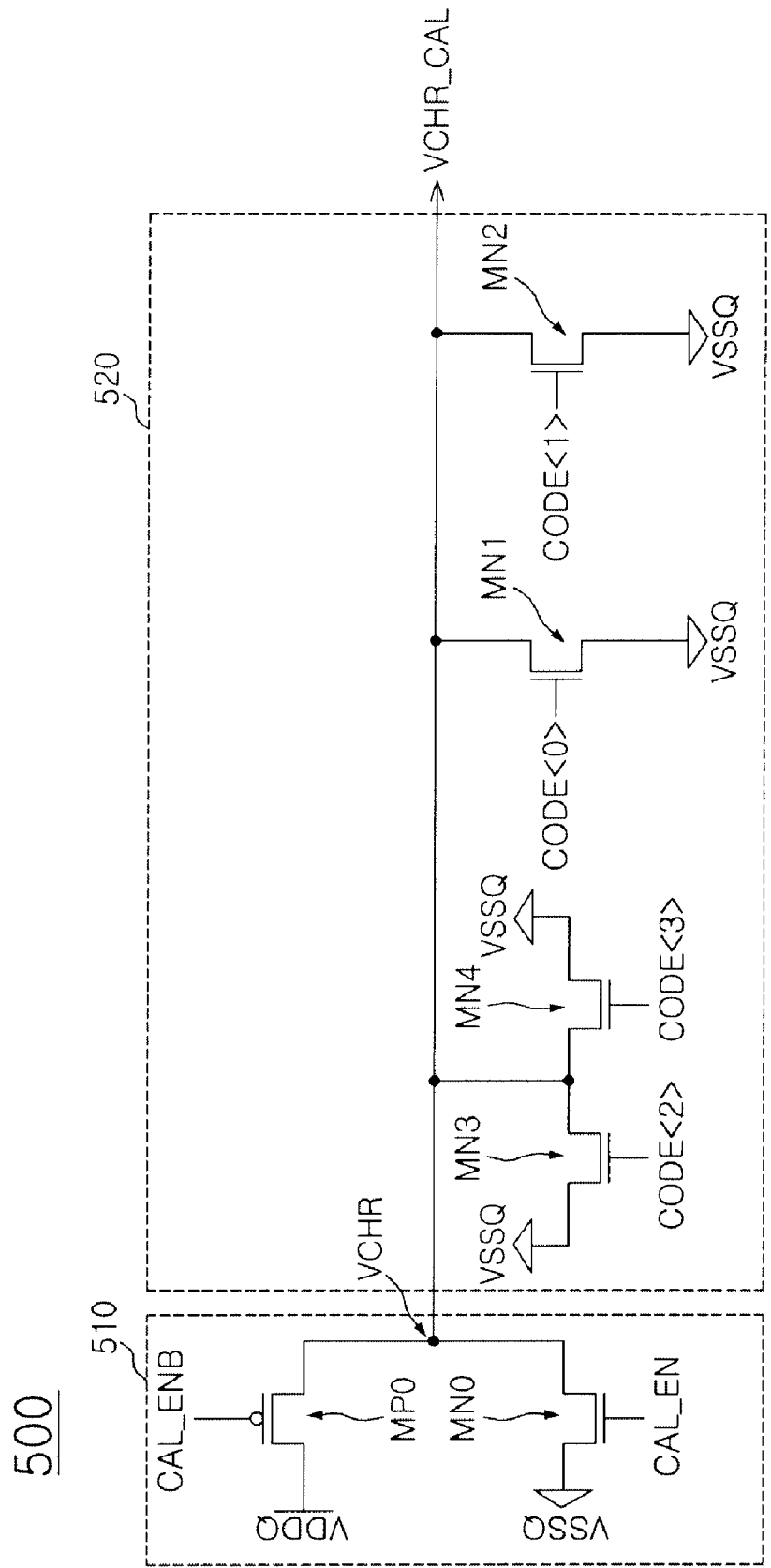
FIG. 2 is a circuit diagram of a detection block of FIG. 1.

Referring to FIG. 2, the detection block 500 includes a sampler 510 and a current calibration unit 520.

The sampler 510, which is operatively coupled to the current calibration unit 520, is configured to output the characteristic voltage VCHR as a result obtained by detecting operation characteristic is variations of basic elements composing the semiconductor integrated circuit, for example, transistors.

In the semiconductor integrated circuit, nearly every circuit configuration as well as the data driver is implemented as a combination of transistors. When a PVT variation occurs, the operation characteristics of the transistors are varied, and the variation of the operation characteristics may have an effect upon the operation characteristic of the semiconductor memory circuit. Therefore, it is possible to figure out a driving impedance variation of the data driver through the detection of the variation in operation characteristics of the transistors.

Therefore, the sampler 510 according to the embodiment includes a PMOS transistor MPO and an NMOS transistor MNO. When the sampler 510 is designed, the sizes of the PMOS transistor and the NMOS transistor are adjusted in such a manner that a current ratio of the PMOS transistor MPO to the NMOS transistor MNO corresponds to a predetermined ratio, for example, 1:1.

The PMOS transistor MPO includes a gate receiving the period calibration signal CAL_ENB and a source receiving the power supply voltage VDDQ.

The NMOS transistor MNO includes a gate receiving the period calibration signal CAL_EN, a source receiving a ground voltage VSSQ, and a drain connected to the drain of the PMOS transistor MPO.

As described above, the sampler 510 is designed in such a manner that the current ratio of the PMOS transistor to the NMOS is transistor corresponds to 1:1 through the size adjustment. Therefore, under an assumption that a PVT variation does not occur, when the period calibration signals CAL_EN and CAL_ENB are activated, the voltage level of a node through which the drains are connected, that is, the characteristic voltage VCHR should be equalized to VDDQ/2, that is, the level of the reference voltage VREFQ.

However, when a PVT variation occurs, the characteristic voltage VCHR, indicating the operation characteristics of the PMOS transistor and the NMOS transistor, may have a different level from VDDQ/2. Therefore, it is possible to detect the operation characteristic variations of the PMOS transistor MPO and the NMOS transistor MNO through the level of the characteristic voltage VCHR.

When the detection block 500 is designed in such a manner that a plurality of transistors MN1 through MN4 provided therein have different sizes, the resolution of the calibrated characteristic voltage VCHR_CAL may be controlled. For example, the amount of current flowing when the transistors MN1 and MN2, among the transistors MN1 through MN4, are turned on may be set to be larger than the amount of current flowing when the transistors MN3 and MN4 are turned on.

The current calibration unit 520 is configured to calibrate the level of the characteristic voltage VCHR by varying the current drivability of the sampler 510 in response to the code signals CODE<0:3>, and output the calibrated characteristic voltage VCHR_CAL.

The variation of the current drivability of the sampler 510 may be performed by varying the current driving ability of the PMOS transistor MPO or NMOS transistor MNO. In this embodiment, the current calibration unit 520 is configured to vary the current driving ability of the NMOS transistor MNO.

The current calibration unit 520 may include the plurality of NMOS transistors MN1 through MN4 which are corresponds to the number of bits of the code signals CODE<0:3>.

Each of the transistors MN1 through MN4 includes a drain connected to the drain of the NMOS transistor MNO of the sampler 510, a source receiving a ground voltage VSSQ, and a gate receiving the corresponding code signal CODE<0:3>.

In this embodiment, the driving impedance variation of the data driver provided in the data driver block 300 is detected through the detection block 500, and the code signals CODE<0:3> are calibrated according to the detected driving impedance variation such that the driving impedance of the data driver is constantly maintained. Therefore, the detection block 500 is designed by modeling the data driver such that the impedance state of the data driver may be precisely detected.

Figure 3:
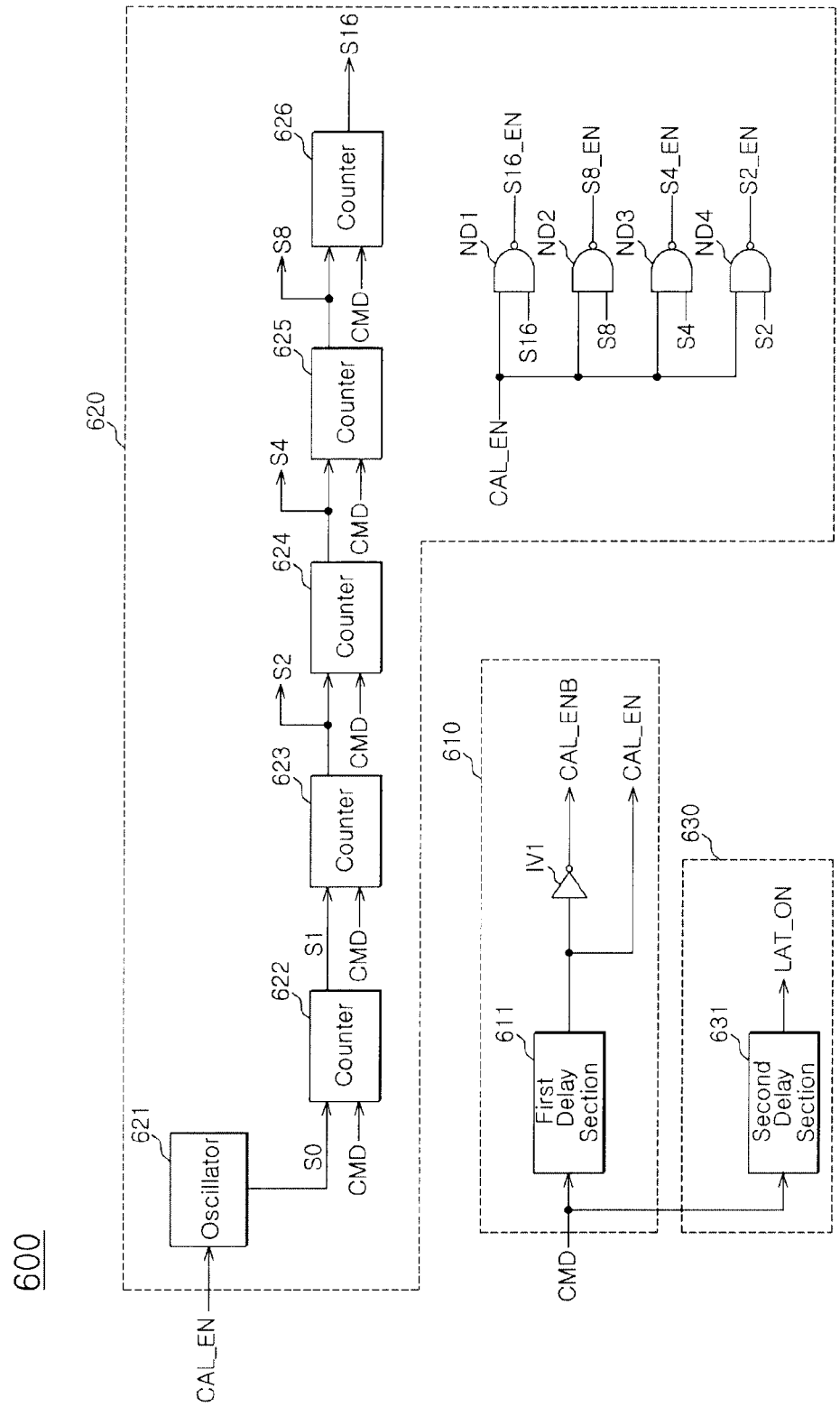
FIG. 3 is a block diagram illustrating the internal configuration of a control signal generation block of FIG. 1.

Referring to FIG. 3, the control signal generation block 600 includes a calibration period signal generation unit 610, a trigger signal generation unit 620, and a code initialization signal generation unit 630. The calibration period signal generation unit 610 is operatively coupled to the trigger signal generation unit 620.

The calibration period signal generation unit 610 includes a first delay section 611 and an inverter IV1. The first delay section 611 is configured to delay a falling edge of the command CMD by a first delay time to generate the calibration period signal CAL_EN, and the inverter IV1 is configured to invert the calibration period signal CAL_EN to generate the calibration period signal CAL_ENB.

The trigger signal generation unit 620 includes an oscillator 621, a plurality of counters 622 through 626, and a plurality of NAND gates ND1 through ND4.

The oscillator 621 is configured to generate an oscillation signal S0 in response to the calibration period signal CAL_EN.

The plurality of counters 622 through 626 are configured to be initialized by the command CMD and sequentially count the oscillation signal S0 to generate a plurality of divided signals S1 through S16.

The plurality of NAND gates ND1 through ND4 are configured to combine the calibration period signal CAL_EN and the divided signals S2 through S16 to generate the trigger signals S2_EN through S16_EN. That is, the trigger signals S2_EN through S16_EN are signals obtained by inverting the divided signals S1 through S16 corresponding to the activation period of the calibration period signals CAL_EN and CAL_ENB.

The code initialization signal generation unit 630 includes a second delay section 631.

The second delay section 631 is configured to delay the falling edge of the command CMD by a second delay time and generate a code initialization signal LAT_ON.

The first delay time of the first delay section 611 is longer than the second delay time of the second delay section 631.

Figure 4:
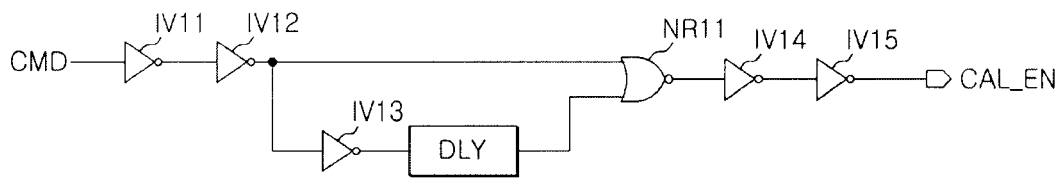
FIG. 4 is a circuit diagram of a first delay section of FIG. 3.

Referring to FIG. 4, the first delay section 611 may include a plurality of inverters IV11 through IV15, a delay DLY, and a NOR gate NR11.

The second delay section 631 may be configured in the same manner as the first delay section 611, except that the delay time of the delay DLY is different.

Figure 5:
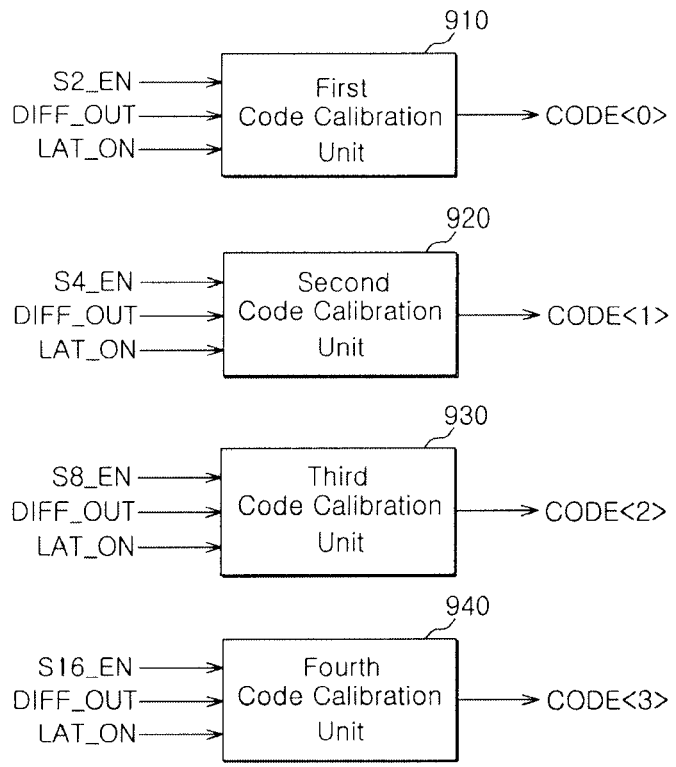
FIG. 5 is a block diagram illustrating the internal configuration of a code calibration block of FIG. 1.

Referring to FIG. 5, the code calibration block 900 includes first through fourth calibration units 910 through 940.

The first code calibration unit 910 is configured to initialize the code signal CODE<0> in response to the code initialization signal LAT_ON, and calibrate the code signal CODE<0> according to the comparison result signal DIFF_OUT, in response to the trigger signal S2_EN.

The second code calibration unit 920 is configured to initialize the code signal CODE<1> in response to the code initialization signal LAT_ON, and calibrate the code signal CODE<1> according to the comparison result signal DIFF_OUT, in response to the trigger signal S4_EN.

The third code calibration unit 930 is configured to initialize the code signal CODE<2> in response to the code initialization signal LAT_ON, and calibrate the code signal CODE<2> according to the comparison result signal DIFF_OUT, in response to the trigger signal S8_EN.

The fourth code calibration unit 940 is configured to initialize the code signal CODE<3> in response to the code initialization signal LAT_ON, and calibrate the code signal CODE<3> according to the comparison result signal DIFF_OUT, in response to the trigger signal S16_EN.

Figure 6:
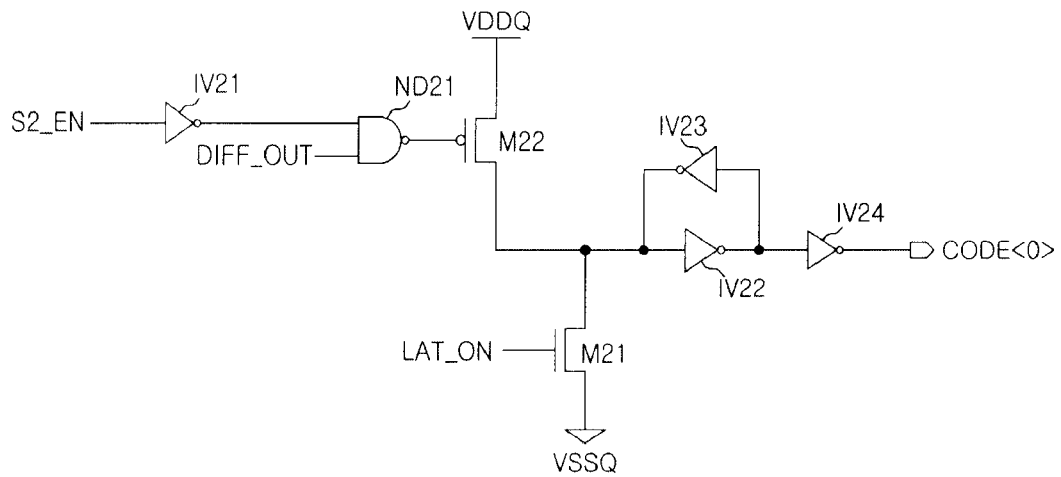
FIG. 6 is a circuit diagram of a first code calibration unit of FIG. 5.

Referring to FIG. 6, the first code calibration unit 910 may include a plurality of inverters IV21 through IV24, a NAND gate ND21, and a plurality of transistors M21 and M22.

As the code initialization signal LAT_ON is activated, the first code calibration unit 910 outputs the code signal CODE<0> at the initial level. Although the initial level may differ depending on the circuit design, the initial level of the code signal CODE<0> is low level in this embodiment. "High level" and "low level" refers to, for example, voltage levels and/or voltage ranges that are predetermined to represent the high level or low level and not necessarily any specific values. It is to be understood that "high level" and "low level" may also be referred to as "logic levels" for example, a "high logic level" and a "low logic level," respectively. Such "logic levels" may also be understood to correspond to logical or binary bit values, for example, where a "low logic level" corresponds to a logical "0" and a "high logic level" corresponds to a logical "1," or vice versa depending on specific implementations in the various embodiments. Referring again to FIG. 6, furthermore, when the trigger signal S2_EN is at a low level, the first code calibration unit 910 maintains the code signal CODE<0> at a low level when the comparison result signal DIFF_OUT is at a low level, and changes the code signal CODE<0> to a high level when the comparison result signal DIFF_OUT is at a high level.

The second code calibration unit 920 is configured in the same manner as the first code calibration unit 910.

Figure 7:
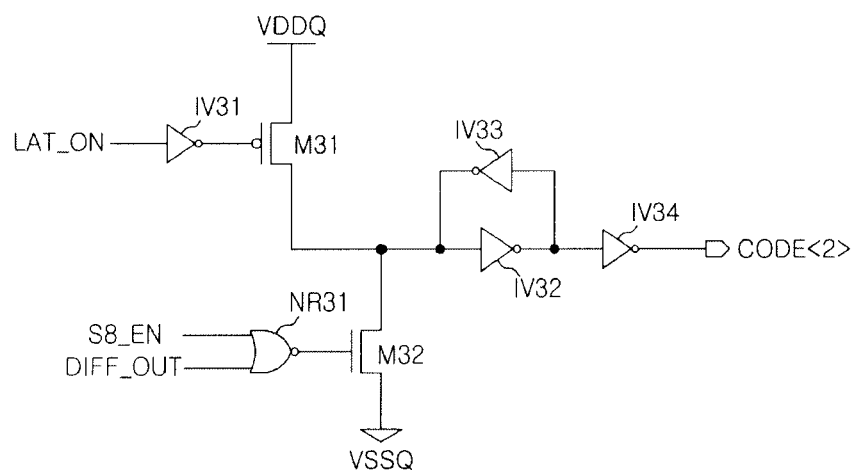
FIG. 7 is a circuit diagram of a third code calibration unit of FIG. 5.

Referring to FIG. 7, the third code calibration unit 930 includes a plurality of inverters IV31 through IV34, a NOR gate NR31, and a plurality of transistors M31 and M32.

As the code initialization signal LAT_ON is activated, the third code calibration unit 930 outputs the code signal CODE<2> at the initial level. Although the initial level may differ depending on the circuit design, the initial level of the code signal CODE<2> is a high level in this embodiment. When the trigger signal S8_EN is at a low level, the third code calibration unit 930 changes the code signal CODE<2> to a low level when the comparison result signal DIFF_OUT is at a low level, and maintains the code signal CODE<2> to a high level when the comparison result signal DIFF_OUT is at a high level.

The fourth code calibration unit 940 is configured in the same manner as the third code calibration unit 930.

Now, the operation of the data driving impedance auto-calibration circuit according to the embodiment will be described as follows.

When a command CMD such as a power-up signal, a refresh signal, or a mode register set signal is inputted, the control signal generation block 600 generates the calibration period signals CAL_EN and CAL_ENB, the trigger signals S2_EN through S16_EN, and the code initialization signal LAT_ON, as shown in FIG. 8.

The code calibration block 900 initializes the code signals CODE<0:3> to an initial value of 0011 according to the circuit design in this embodiment, in response to the code initialization signal LAT_ON, and provides the initialized code signal CODE<0:3> to the detection block 500.

The detection block 500 is enabled in response to the activation of the calibration period signals CAL_EN and CAL_EN, and outputs the calibrated characteristic voltage VCHR_CAL corresponding to the initial value of the code signals CODE<0:3>.

The comparison block 700 is enabled in response to the activation of the calibration period signals CAL_EN and CAL_ENB, and compares the reference voltage VREFQ with the calibrated characteristic voltage VCHR_CAL to output the comparison result signal DIFF_OUT.

When the calibrated characteristic voltage VCHR_CAL is lower than the reference voltage VREFQ, the comparison result signal DIFF_OUT may set to a high level. When the calibrated characteristic voltage VCHR_CAL is higher than the reference voltage VREFQ, the comparison result signal DIFF_OUT may be set to a low level.

As described above with reference to FIGS. 6 and 7, when the comparison result signal DIFF_OUT has a high level in a state in is which the trigger signals S2_EN and S4_EN have a low level, that is, when the calibrated characteristic voltage VCHR_CAL is lower than the reference voltage VREFQ, the first and second code calibration units 910 and 920 change the code signals CODE<0:1> to a high level.

As the code signals CODE<0:1> are changed to a high level, the transistors MN1 and MN2 of the current calibration unit 520 of FIG. 2 are turned on. At this time, the transistors MN3 and MN4 of the current calibration unit 520 are already turned on.

That is, when the calibrated characteristic voltage VCHR_CAL is lower than the reference voltage VREFQ, the transistors MN1 and MN2 of the current calibration unit 520 of FIG. 2 are additionally turned on to increase a sink current. Then, the calibrated characteristic voltage VCHR_CAL is raised.

Meanwhile, when the comparison result signal DIFF_OUT has a low level in a state in which the trigger signals S8_EN and S16_EN have a low level, the third and fourth code calibration units 930 and 940 change the code signals CODE<2:3> to a low level.

As the code signals CODE<2:3> are changed to a low level, the transistors MN3 and MN4 of the current calibration unit 520 of FIG. 2 are turned off. At this time, the transistors MN1 and MN2 of the current calibration unit 520 are already turned on.

That is, when the calibrated characteristic voltage VCHR_CAL is higher than the reference voltage VREFQ, the transistors MN3 and MN4 of the current calibration unit 520 of FIG. 2 is are turned off to reduce the sink current. Then, the calibrated characteristic voltage VCHR_CAL is lowered.

The comparison block 700 compares the varied calibrated characteristic voltage VCHR_CAL with the reference voltage VREFQ and outputs the comparison result signal DIFF_OUT.

During the activation period of the calibration period signals CAL_EN and CAL_ENB, the trigger signals S2_EN through S16_EN are periodically changed.

Whenever the trigger signals S2_EN through S16_EN are changed to a low level, the calibrated characteristic voltage VCHR_CAL is varied, the comparison result signal DIFF_OUT is outputted according to the variation, and the code signals CODE<0:3> are calibrated.

As the calibration period signals CAL_EN and CAL_ENB are deactivated, the code signals CODE<0:3> are maintained to the final calibrated value, and provided to the data driver block 300.

The driving impedance of the data drivers provided in the data driver block 300 is determined according to the code signals CODE<0:3>. The data drivers drive data DATA outputted from the code block 200 according to the determined driving impedance, and then output the data DATA.

The data driving impedance auto-calibration circuit according to the embodiment may check a PVT variation internally, and constantly maintain data driving impedance by calibrating the data driving impedance according to the PVT variation.

The semiconductor integrated circuit according to the embodiment may improve a data output characteristic, because the data driving impedance is calibrated through the PVT variation check and constantly maintained.

While certain embodiments have been described above, it will be understood to those skilled in the art that the embodiments described are by way of example only. Accordingly, the data driving impedance auto-calibration circuit described herein should not be limited based on the described embodiments. Rather, the data driving impedance auto-calibration circuit described herein should only be limited in light of the claims that follow when taken in conjunction with the above description and accompanying drawings.

What is claimed is:

1. A data driving impedance auto-calibration circuit comprising:
   a detection block configured to detect an operation characteristic variation of an element, according to a code signal, and generate a calibrated characteristic voltage;
   a comparison block, operatively coupled to the detection block, configured to compare the calibrated characteristic voltage with a reference voltage and output a comparison result signal;
   a code calibration block, operatively coupled to the detection block, configured to calibrate the code signal according to the comparison result signal; and
   a control signal generation block,
   wherein the control signal generation block comprises:
   a calibration period signal generation unit configured to delay a command by a first delay time to generate a calibration period signal for defining an activation period of the detection block;
   a trigger signal generation unit, operatively coupled to the calibration period signal generation unit, configured to combine a divided signal with the calibration period signal to generate a trigger signal for enabling code calibration operation of the code calibration block; and
   a code initialization signal generation unit configured to delay the command by a second delay time to generate the code initialization signal.

2. The data driving impedance auto-calibration circuit according to claim 1, wherein the detection block comprises:
- a sampler configured to generate the characteristic voltage using a P-type transistor and an N-type transistor which are designed to have a preset current ratio; and
- a current calibration unit, operatively coupled to the sampler, configured to generate the calibrated characteristic voltage by calibrating a current amount of the P-type transistor or N-type transistor using a plurality of transistors which are connected to the P-type transistor or N-type transistor and operate according to the code signal.

3. The data driving impedance auto-calibration circuit according to claim 2, wherein one or more of the plurality of transistors has or have a different current amount from the other transistors.

4. The data driving impedance auto-calibration circuit according to claim 2, wherein the P-type transistor and the N-type transistor are designed to have a current ratio of 1:1, a power supply voltage is applied to a source of the P-type transistor, a ground voltage is applied to a source of the N-type transistor, drains of the P-type transistor and the N-type transistor are connected to each other, and the characteristic voltage is generated through the connected drains.

5. The data driving impedance auto-calibration circuit according to claim 2, wherein some of the plurality of transistors are turned on according to initialization of the code signal.

6. The data driving impedance auto-calibration circuit according to claim 1, wherein the code calibration block comprises a plurality of code calibration units configured to calibrate respective bits of the code signal, and each of the code calibration units is configured to maintain a bit of the code signal corresponding to the code calibration unit to an initial value or change the bit to a different value from the initial value, depending on the comparison result signal.

7. The data driving impedance auto-calibration circuit according to claim 1, wherein the command comprises a power up signal, a refresh signal, and a mode register set signal.

8. The data driving impedance auto-calibration circuit according to claim 1, wherein the trigger signal generation unit comprises:
- an oscillation section configured to generate an oscillation signal in response to the calibration period signal;
- a plurality of counters, operatively coupled to the oscillation section, configured to sequentially count the oscillation signal to generate the divided signal; and
- a logic circuit section, operatively coupled to the plurality of counters, configured to combine the divided signal and the calibration period signal to output the trigger signal.

9. The data driving impedance auto-calibration circuit according to claim 8, wherein the plurality of counters are configured to initialize the outputs thereof in response to the command.

10. A semiconductor integrated circuit comprising:
- a core block comprising a memory area and a circuit configuration for writing and reading data to and from the memory area;
- a data driver block, operatively coupled to the core block, configured to drive data outputted from the core block to impedance which is set according to a code signal; and
- a data driving impedance calibration block, operatively coupled to the data driver block, configured to calibrate a code value of the code signal depending on a difference between a characteristic voltage and a target value, the characteristic voltage being generated by detecting an operation characteristic variation of an element through a sampler inside the data driving impedance calibration block, wherein the data driving impedance calibration block comprises:
- a detection block configured to generate a calibrated characteristic voltage by calibrating the characteristic voltage generated by detecting the operation characteristic variation of the element, according to the code signal;
- a comparison block, operatively coupled to the detection block, configured to compare the calibrated characteristic voltage with a reference voltage and output a comparison result signal;
- a code calibration block, operatively coupled to the detection block, configured to calibrate the code signal according to the comparison result signal; and
- a control signal generation block, operatively coupled to the detection block, the code calibration block, and the comparison block, and configured to generate a calibration period signal for defining an activation period of the detection block, a code initialization signal for initializing the code signal, and a trigger signal for enabling the code calibration operation of the code calibration block, in response to a command, wherein the command comprises a power up signal, a refresh signal, and a mode register set signal.

11. The semiconductor integrated circuit according to claim 10, wherein the sampler is configured to generate the characteristic voltage through a node connected to a P-type transistor and an N-type transistor which are designed to have a preset current ratio, and generate the calibrated characteristic voltage by calibrating a current amount of the P-type transistor or N-type transistor according to the code signal.

12. The semiconductor integrated circuit according to claim 10, wherein the sampler is configured to generate the characteristic voltage through a node connected to a P-type transistor and an N-type transistor which are designed to have a preset current ratio, and generate the calibrated characteristic voltage by calibrating the number of transistors which are turned on among a plurality of transistors connected to the P-type transistor or N-type transistor, according to the code signal.

13. The semiconductor integrated circuit according to claim 12, wherein one or more of the plurality of transistors has or have a different current amount from the other transistors.

14. The semiconductor integrated circuit according to claim 10, wherein the code calibration block comprises a plurality of code calibration units configured to calibrate respective bits of the code signal, and each of the code calibration units is configured to maintain a bit of the code signal corresponding to the code calibration unit to an initial value or change the bit to a different value from the initial value, depending on the comparison result signal.

15. The semiconductor integrated circuit according to claim 10, wherein the control signal generation block comprises:
- a calibration period signal generation unit configured to delay the command by a first delay time to generate the calibration period signal;
- a trigger signal generation unit, operatively coupled to the calibration period signal generation unit, configured to combine a divided signal with the calibration period signal to generate the trigger signal; and a code initialization signal generation unit configured to delay the command by a second delay time to generate the code initialization signal.

16. The semiconductor integrated circuit according to claim 15, wherein the trigger signal generation unit comprises:

an oscillation section configured to generate an oscillation signal in response to the calibration period signal;

a plurality of counters, operatively coupled to the oscillation section, configured to sequentially count the oscillation signal to generate the divided signal; and a logic circuit section, operatively coupled to the plurality of counters, configured to combine the divided signal and the calibration period signal to output the trigger signal.

* * * * *